United States Patent
Sakama et al.

(10) Patent No.: US 7,508,347 B2
(45) Date of Patent: Mar. 24, 2009

(54) RADIO FREQUENCY INTEGRATED CIRCUIT TAG AND METHOD OF USING THE RFIC TAG

(75) Inventors: Isao Sakama, Hiratsuka (JP); Minoru Ashizawa, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 140 days.

(21) Appl. No.: 11/741,003

(22) Filed: Apr. 27, 2007

(65) Prior Publication Data

US 2008/0111760 A1 May 15, 2008

(30) Foreign Application Priority Data

Nov. 10, 2006 (JP) ............................. 2006-305791

(51) Int. Cl.
*H01Q 1/38* (2006.01)
(52) U.S. Cl. .............................. 343/700 MS; 340/572.7
(58) Field of Classification Search .......... 343/700 MS, 343/720, 767; 340/572.7, 572.8; 235/492
See application file for complete search history.

(56) References Cited

U.S. PATENT DOCUMENTS

| | | | | |
|---|---|---|---|---|
| 7,256,739 | B2 * | 8/2007 | Usami | ................. 343/700 MS |
| 7,416,135 | B2 * | 8/2008 | Tanaka et al. | ............... 235/492 |
| 2007/0069037 | A1 * | 3/2007 | Kawai | ........................ 235/492 |

FOREIGN PATENT DOCUMENTS

JP      2005-309811      11/2005

\* cited by examiner

*Primary Examiner*—Hoang V Nguyen
(74) *Attorney, Agent, or Firm*—Mattingly, Stanger, Malur & Brundidge, PC

(57) ABSTRACT

An RFIC tag includes an IC chip and a thin metal plate. The IC chip is mounted approximately in the center of a slit part on the thin metal plate. The thin metal plate has connecting parts at both longitudinal-direction ends fixed on a metal member by soldering, and the undersurface of the slit part, which has an L-shaped slit thereon, is lifted a predetermined height from the surface of the metal member. The total length ($L2+L1+L2$) is $\frac{1}{4}$ or shorter than the communication wavelength $\lambda$.

14 Claims, 11 Drawing Sheets

RADIO FREQUENCY INTEGRATED CIRCUIT TAG AND METHOD OF USING THE RFIC TAG

INCORPORATION BY REFERENCE

The present application claims priority from Japanese application JP 2006-305791 filed on Nov. 10, 2006, the content of which is hereby incorporated by reference into this application.

CROSS-REFERENCE TO RELATED APPLICATION

The present application relates to subject matters described in a co-pending patent application Ser. No. 11/741,012 to be filed on Apr. 27, 2007 entitled "IC TAG AND METHOD FOR FABRICATING THE SAME" by the same inventors of the present application and assigned to the assignees of the present application. The disclosures of this co-pending application are incorporated herein by reference.

BACKGROUND OF THE INVENTION

The present invention relates to an RFIC tag attached to a metal object and a method of using the RFIC tag.

Recently, an RFIC (Radio Frequency Integrated Circuit) system is widely used where data is communicated via a radio wave between an RFIC tag, which contains an IC chip activated by a radio wave, and a reader, a writer, or a reader/writer (hereinafter generically called a reader/writer). Because this RFIC system uses an antenna, provided both on an RFIC tag and a reader/writer, for data communication to allow data to be communicated even if the RFIC tag is away from the reader/writer and because an RFIC tag is resistant to stain, the system finds various applications in production management in a factory, physical distribution management, room entry/exit management, and so on.

An RFIC tag having a dipole antenna and operating in the UHF band or SHF band does not work when it is placed near to a metal, for example, when it is placed directly on a metal object. Therefore, when an RFIC tag is attached to a metal object, a spacer made of plastic or rubber is provided between an RFIC tag and a metal object to keep spacing between the metal object and the antenna for suppressing the effect of the metal.

However, the problem is that, if a thinner spacer is used to narrow the spacing between the surface of the metal object and the antenna, the RFIC does not work. On the other hand, if a thick spacer is used to increase the spacing between the metal object and the antenna, the communication distance is extended but the RFIC tag protrudes from the surface of the metal object and, in this case, there is a possibility that the metal object, when used, strikes against a surrounding object or against another metal object with the result that the RFIC tag is damaged.

To solve the problem, JP-A-2005-309811 (see FIG. 2, FIG. 4, FIG. 6, and FIG. 7) discloses an RFIC tag in which a soft magnetic material is provided on the mounting face of the metal object on which the dipole antenna is attached, or a soft magnetic material and a spacer are provided from the metal object side on the mounting face of the metal object on which the dipole antenna is attached, or a spacer, a soft magnetic material, and a spacer are provided from the metal object side on the mounting face of the metal object on which the dipole antenna is attached.

SUMMARY OF THE INVENTION

However, according to the RFIC tag of the conventional technology disclosed in JP-A-2005-309811, an IC chip is mounted on a dipole antenna which is, in turn, mounted on the metal object. This structure has a disadvantage in that an antenna that is half-wavelength ($\lambda/2$) long, where $\lambda$ is the communication wavelength, is required and therefore the RFIC tag becomes larger.

In view of the foregoing, it is a main object of the present invention to provide an RFIC tag that can be mounted on a metal object and that is smaller than the conventional RFIC tag.

An RFIC tag in a first aspect of the present invention is an RFIC tag having an IC chip, which is activated by a radio wave, mounted on a conductive thin plate or thin film. The conductive thin plate or thin film is mounted in such a way that connecting parts, provided at both ends thereof, are connected to a metal object electrically or via electrostatic capacitory coupling to cause the metal object to work as an antenna of the IC chip. The conductive thin plate or thin film has an impedance matching circuit in an intermediate part for matching an impedance of the antenna with an impedance of the IC chip. The impedance matching circuit is mounted with at least a predetermined spacing from the metal object. The length of the impedance matching circuit is shorter than $\lambda/2$ where $\lambda$ is a wavelength of a radio wave to be transmitted or received.

According to the present invention, because the metal surface of the metal object can be used as the antenna of the IC chip, the communication can be performed with the thin plate, on which the IC chip is mounted, as an RFIC tag, even if the length of the impedance matching circuit on the conductive thin plate or thin film, on which the IC chip is mounted, is shorter than $\frac{1}{2}$ of the communication wavelength $\lambda$ of the IC chip.

An RFIC tag in a second aspect of the present invention is a small inlet-type RFIC tag including an IC chip activated by a radio wave and a small antenna having an impedance matching circuit. The connecting parts, provided at predetermined ends of the small antenna, are connected to a metal object electrically or via electrostatic capacitory coupling to cause the metal object to work as an antenna of the IC chip. On the small antenna, the impedance matching circuit is mounted with at least a predetermined spacing from the metal object. The length of the impedance matching circuit of the small antenna is shorter than $\lambda/2$ where $\lambda$ is the wavelength of a radio wave to be transmitted or received.

According to the present invention, because the metal surface of the metal object can be used as the antenna of the IC chip, the communication can be performed with the small inlet as an RFIC tag, even if the length of the small antenna of the small inlet is shorter than $\frac{1}{2}$ of the communication wavelength $\lambda$ of the IC chip. The present invention also includes the using method of the RFIC tag.

According to the present invention, a small RFIC tag that can be mounted on a metal object is provided.

Other objects, features and advantages of the invention will become apparent from the following description of the embodiments of the invention taken in conjunction with the accompanying drawings.

DESCRIPTION OF THE EMBODIMENTS

An RFIC tag in the embodiments to carry out the present invention will be described below with reference to the drawings.

First Embodiment

Figure 1A:
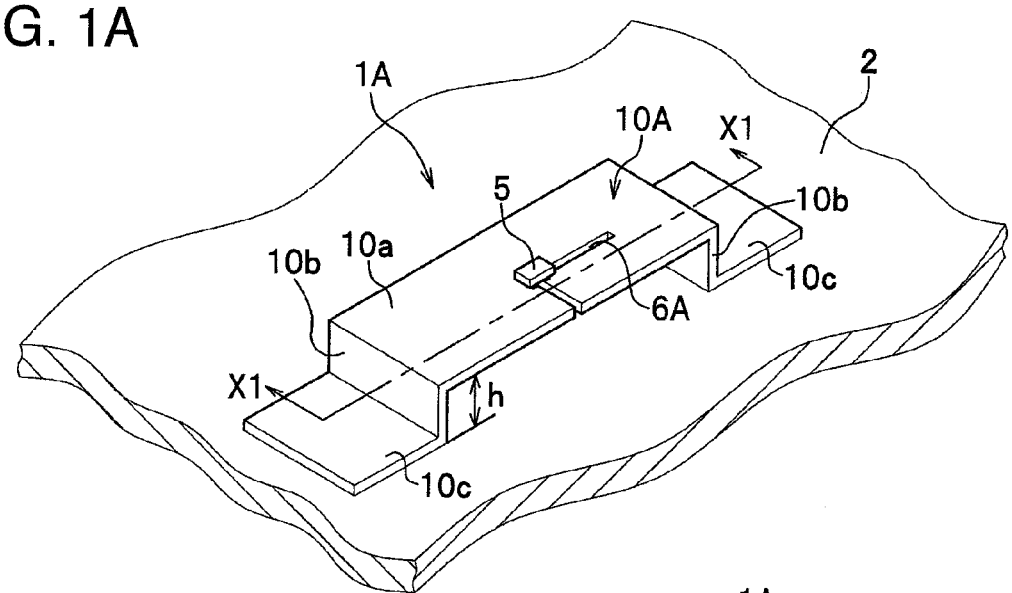
FIG. 1A is a diagram showing the general configuration of an RFIC tag in a first embodiment mounted of the present invention and is a perspective view showing that the RFIC tag is attached on a metal member (metal object).
Figure 1B:
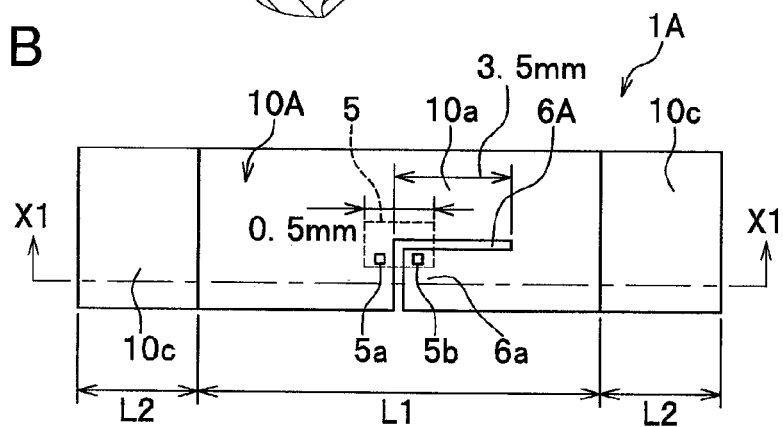
FIG. 1B is a top view of the RFIC tag from which an IC chip in the first embodiment is removed.
Figure 1C:
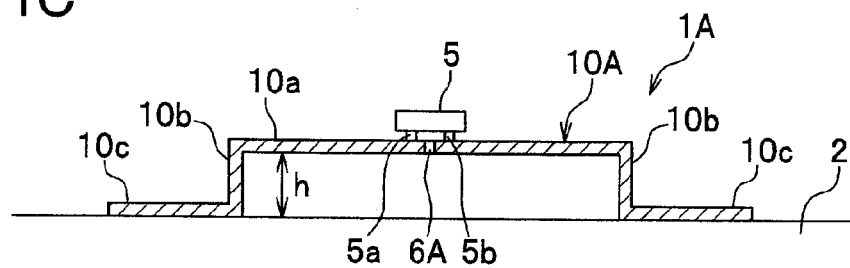
FIG. 1C is a cross sectional view taken on the arrow line X1-X1 in FIG. 1A.
Figure 1D:
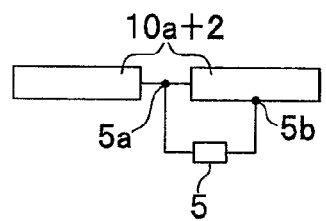
FIG. 1D is an equivalent circuit diagram of the RFIC tag in the first embodiment.

First, the following describes an RFIC tag in a first embodiment of the present invention with reference to FIG. 1A, FIG. 1B, FIG. 1C, and FIG. 1D. FIG. 1A is a perspective view showing an RFIC tag in the first embodiment mounted on a metal member (metal object), FIG. 1B is a top view of the RFIC tag from which an IC chip is removed, FIG. 1C is a cross sectional view taken on the arrow line X1-X1 in FIG. 1A, and FIG. 1D is an equivalent circuit diagram of the RFIC tag.

An RFIC tag 1A includes an IC chip 5 and a thin metal plate (thin conductive plate) 10A of copper (Cu) or aluminum (Al). As shown in FIG. 1A, the IC chip 5 is mounted approximately in the center of a part (hereinafter called a slit part) 10a that is the intermediate part in the longitudinal direction of the thin metal plate 10A where an impedance matching circuit is provided. The thin metal plate 10A is structured in such a way that connecting parts 10c at both longitudinal-direction ends are fixed on a metal member 2 by a conductive adhesive or welding such as soldering, not shown, and that the undersurface of the slit part 10a is lifted a predetermined height h (for example, 100 µm or higher) above the surface of the metal member 2 by means of feet 10b that are bent approximately at a right angle.

As shown in FIG. 1B, the slit part 10a has a slit 6A that is a cut extending from approximately the midpoint of one of the long sides to approximately the half of the width and, in addition, bent at a right angle into the longitudinal direction to form an L shape when viewed from top. The IC chip 5 is mounted on the thin metal plate 10A, for example, by electrically connecting through ultrasonic bonding, so that signal input/output electrodes 5a and 5b, which are terminals for supplying power to the antenna of the IC chip 5, correspond to the positions 5a and 5b indicated by the rectangles, that is, so that the signal input/output electrodes are opposed each other across the slit 6A (see FIG. 1C).

The thin metal plate 10A is, for example, 100 µm thick. The thin metal plate 10A should be strong enough for the slit part 10a to be supported a predetermined height from the surface of the metal member 2, and the thickness of the thin metal plate 10A should be appropriately determined according to its material.

The longitudinal length L1 of the slit part 10a is, for example, 7 mm or longer that is the longitudinal length of the L-shaped slit 6A (for example, 3.5 mm (see FIG. 1B)) plus the length, equal to the width of the IC chip 5, at both ends in the longitudinal direction. The length L2 of the connecting part 10c is, for example, about 5 mm. Then, the total length L2+L1+L2 is about 17 mm ($\lambda/7$ or shorter in terms of wavelength $\lambda$). The experiment shows that the length L1 of about 20 mm and the total length L2+L1+L2 of about 30 mm make the communication length relatively long.

It is confirmed that, if the height h from the surface of the metal member 2 to the undersurface of the slit part 10a is 100 µm or longer, the communication can be performed. The larger the value of h, the longer the communication distance.

The numeric values given above are those for a configuration where the longitudinal width of the IC chip 5 is about 0.5 mm and the communication frequency of the IC chip 5 is 2.45 GHz. The length of the slit 6A, that is, the length L1 of the slit part 10a, should be appropriately set according to the level of the impedance matching. When the connecting part 10c is electrically connected to the surface of the metal member 2 by soldering, the length L2 may be any length but, when the connecting part 10c is pasted by an insulating adhesive, that is, when connected through electrostatic capacity coupling, the length L2 should be about 5 mm.

When the signal input/output electrodes 5a and 5b of the IC chip 5 are electrically connected respectively to the thin metal plate parts of the slit part 10a between which there is the slit 6A, the part of a stub 6a, formed by the slit 6A (see FIG. 1B), is connected in series between the slit part 10a, which works as an antenna, the metal member 2, and the IC chip 5. The part of this stub 6a works as a series-connected inductance component. This inductance component cancels the capacitive component in the IC chip 5 for better impedance matching between the antenna and the IC chip 5.

That is, the IC chip 5 can use the enough-area metal member 2 as the antenna and, at the same time, match the impedance of the IC chip 5 with the impedance of the antenna formed by the slit part 10a and the metal member 2. Such a slit part 10a including such the slit 6A is called an impedance matching circuit.

The impedance matching is determined by the inductance component of the stub 6a which is determined by the lengths to the corner of the L shape of the slit 6A.

In this embodiment, because the metal member 2, which is the mounting member of the RFIC tag 1A, works as the antenna of the RFIC tag 1A, the longitudinal length of the slit part 10a of the RFIC tag 1A is as short as ¼ or less of the communication wavelength λ. Even if the length, whose minimum total length is about 17 mm, is extended preferably to about 30 mm to extend the communication distance, the longitudinal length is ¼ or less of the wavelength λ, meaning that the communication can be performed via the small RFIC tag 1A. That is, because the surface of the metal object can be used as the antenna of the IC chip 5 in this embodiment, the communication can be performed with the thin metal plate, on which the IC chip 5 is mounted, as an RFIC tag even if the length of the thin metal plate, on which the IC chip 5 including the impedance matching circuit is mounted, is shorter than ½ of the communication wavelength λ of the IC chip 5.

In addition, because the spacing, 100 µm or longer, is only required between the undersurface of the slit part 10a and the metal member 2 to allow it to work as the impedance matching circuit, the protrusion from the surface of the metal member 2 is small and thus the RFIC tag 1A is less likely to be hung when used.

The metal member 2 to which the RFIC tag 1A in this embodiment is applicable is conductive metal such as aluminum (Al), carbon steel, stainless steel, and copper (Cu). Note that the RFIC tag 1A in this embodiment is applicable to stainless steel whether it is magnetic or not.

Although the thin metal plate 10A is used in this embodiment, the present invention is not limited to it. Instead of a conductive thin metal plate, a thin plate composed of a conductive thin plate or a conductive resin, which has a conductive thin metal film thereon formed through plating, disposition, or spattering on the surface of a resin plate, may also be used.

Various Modifications of First Embodiment

Next, the following describes modifications of the first embodiment. The same reference numeral is given to components having the same configuration in the first embodiment and repetitive description will not be given.

Figure 2A:
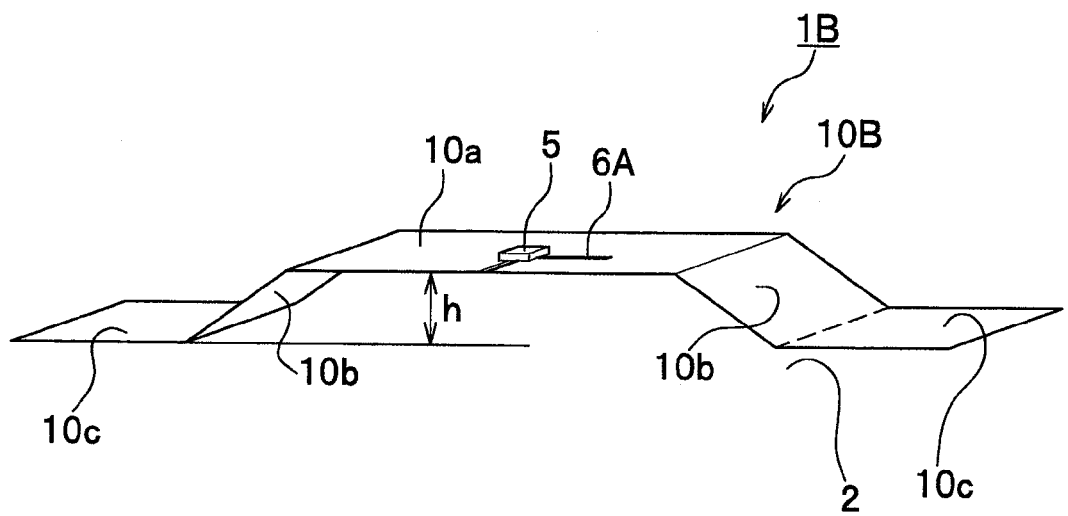
FIG. 2A is a diagram showing the general configuration of an RFIC tag in a modification of the first embodiment of the present invention and is a perspective view of the RFIC tag whose feet are mounted at a different setting angle.

FIG. 2A shows an RFIC tag 1B whose feet 10b of a thin metal plate 10B are mounted at a setting angle different from that of the feet 10b of the RFIC tag 1A so that the feet are obliquely widen toward the bottom. Setting the angle of the feet 10b of the thin metal plate 10B as shown in FIG. 2A has an advantage that, when a hard material is used for the thin metal plate 10B, prevents the plate from being broken when it is bent.

Figure 2B:
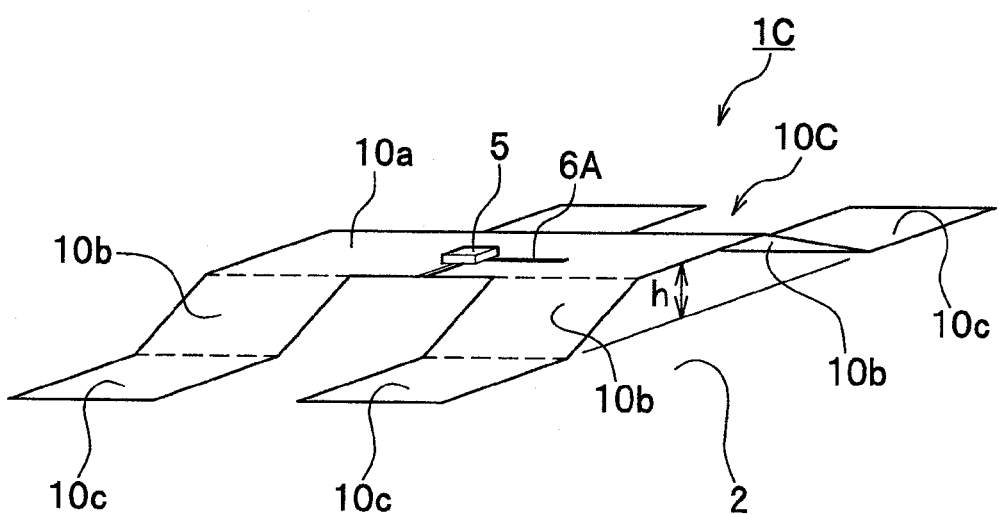
FIG. 2B is a perspective view of an RFIC tag whose feet and connecting parts are extended in the width direction from a total of four positions, that is, from both width-direction ends of the longitudinal-direction ends of a slit part.

FIG. 2B shows an RFIC tag 1C whose feet 10b and connecting parts 10c of a thin metal plate 10C are extended in the width direction from a total of four positions, that is, from both width-direction ends of the longitudinal-direction ends of the slit part 10a. Arranging the feet 10b and the connecting parts 10c in this way maintains the spacing between the slit part 10a in the intermediate part and the metal member 2 more reliably.

Figure 3A:
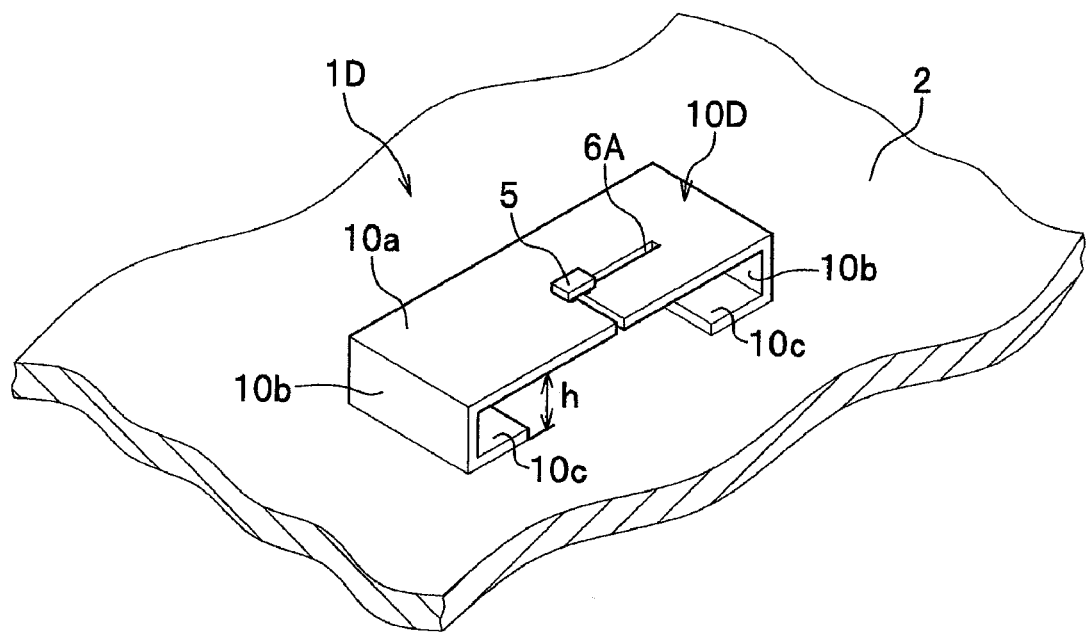
FIG. 3A is a diagram showing the general configuration of an RFIC tag in another modification of the first embodiment of the present invention and is a perspective view of the RFIC tag in which the connecting parts are bent inward at a right angle with respect to the feet so that the connecting parts are positioned below the slit part.
Figure 3B:
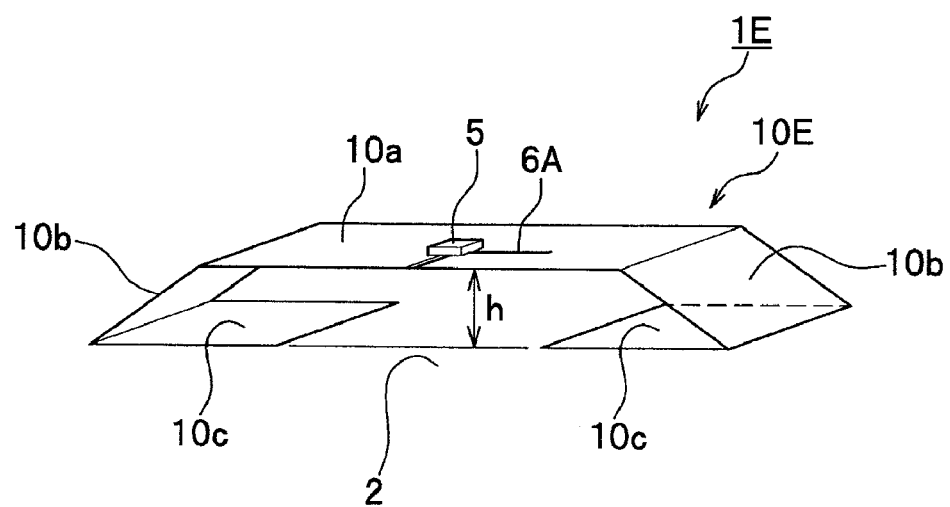
FIG. 3B is a perspective view of an RFIC tag whose feet are mounted at a setting angle different from that of the feet in FIG. 3A.

FIG. 3A shows an RFIC tag similar to the RFIC tag 1A except only in that the connecting parts 10c are bent inward at a right angle with respect to the feet 10b of a thin metal plate 10D so that the connecting parts 10c are positioned below the slit part 10a. This mounting form makes the longitudinal direction part more compact than that in the first embodiment. In addition, when a thin plate having a conductive metal film formed on the top thereof is used instead of a thin metal plate, the connecting parts 10c having this form ensures easy electrical connection with the metal member 2. FIG. 3B shows an RFIC tag 1E whose feet 10b are mounted at a setting angle different from that of the feet 10b in FIG. 3A so that the feet are obliquely widen toward the bottom.

Figure 4A:
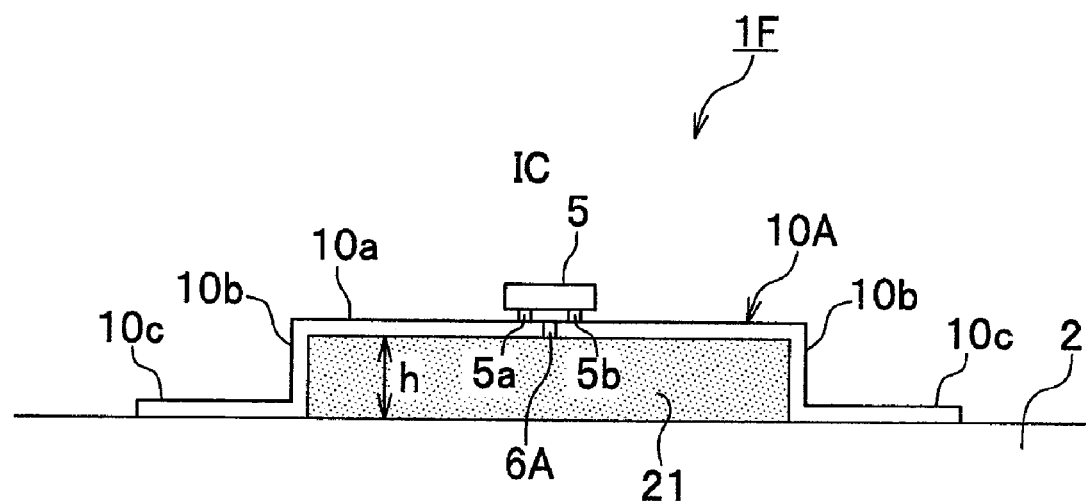
FIG. 4A is a side view of an RFIC tag in still another modification of the first embodiment of the present invention in which a spacer member is provided on the undersurface of the slit part and the connecting parts are extended in a longitudinal direction.
Figure 4B:
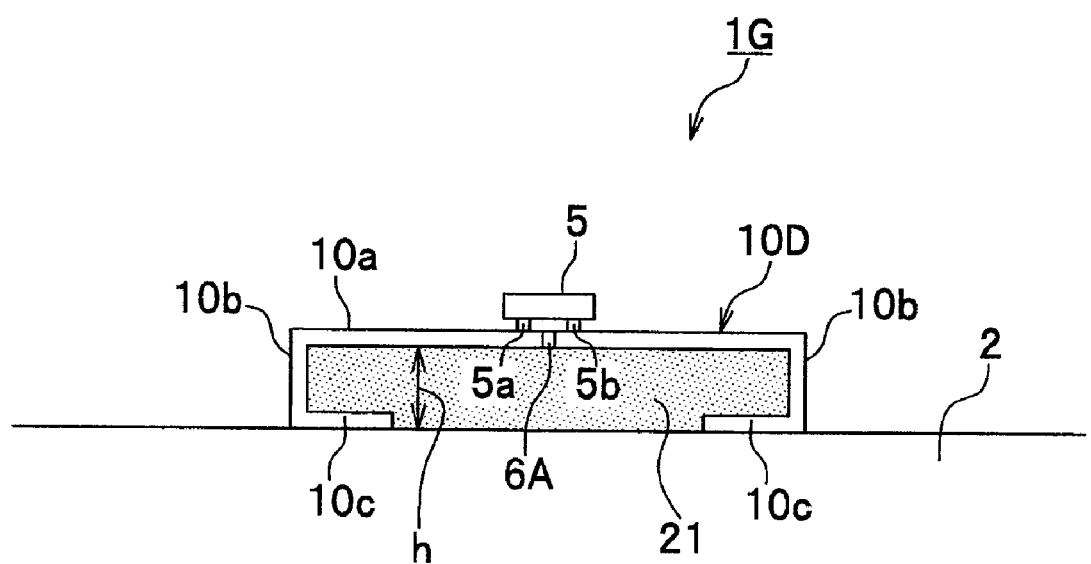
FIG. 4B is a side view showing the connecting parts that are bent toward below the slit part.

FIG. 4A shows an RFIC tag 1F mounted on the metal member 2 with a spacer member 21 of an insulating material provided on the undersurface (mounting face) of the slit part 10a of the RFIC tag 1A. FIG. 4B shows an RFIC tag 1G mounted on the metal member 2 with a spacer member 21 of an insulating material provided below the slit part 10a of the RFIC tag 1D.

The material of the spacer member 21 is preferably a resin thin plate of polyethylene terepthalate (PET) or polypropylene (PP) that is pasted on the undersurface of the slit part 10a with an adhesive material not shown. Using ceramic or epoxy resin, which is used for the package material of a semiconductor, for the spacer member 21 and packaging the whole RFIC tag 1F in the same way the parts, called a chip resistor or a chip capacitor, are packaged make the RFIC tag still easier to handle.

The RFIC tag 1F and the RFIC tag 1G, which have the spacer member 21 provided below the slit part 10a, have an advantage in that the spacing between the slit part 10a and the surface of the metal member 2 is not changed even if an external force is applied to the slit part 10a. That is, this structure prevents the thin metal plate 10A or 10D from being plastic-deformed and prevents the communication distance from being changed.

Figure 5A:
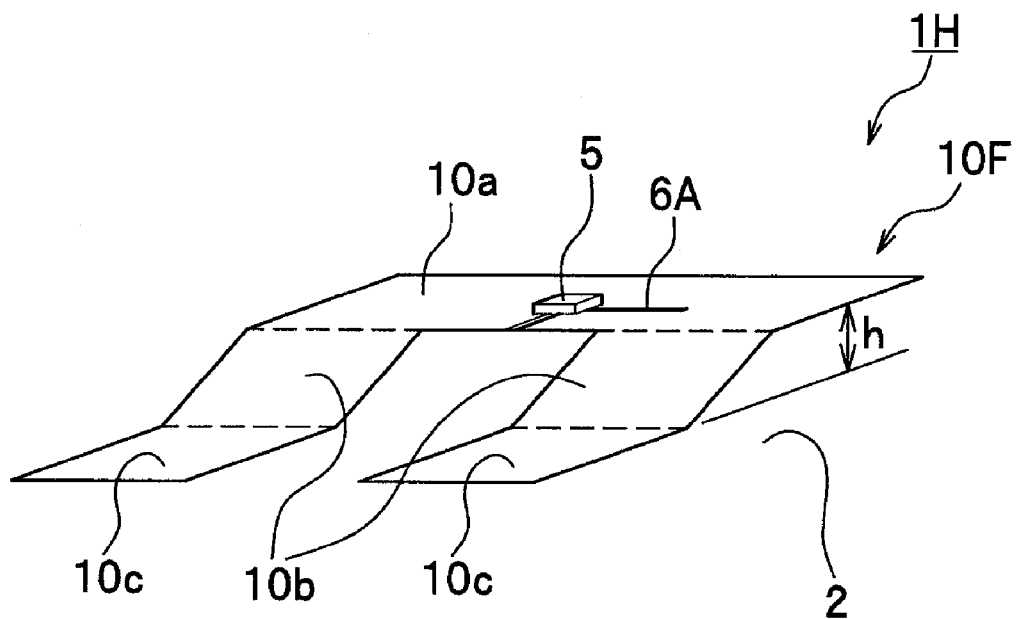
FIG. 5A is a perspective view of a modification of the RFIC tag shown in FIG. 2A.

FIG. 5A shows an RFIC tag 1H, a modification of the RFIC tag IC shown in FIG. 2B, in which the feet 10b and the connecting parts 10c of a thin metal plate 10F are extended from a total of two positions at width-direction ends of one of the longitudinal-direction ends of the slit part 10a into the width direction. In this case, because the height h is maintained only by the strength of the cantilever beam of the thin metal plate 10F, the thin metal plate 10F should preferably be thicker than the RFIC tag 1A.

The RFIC tag 1H can be mounted on the metal member 2 in the longitudinal direction in a more compact way than the RFIC tag 1A.

Figure 5B:
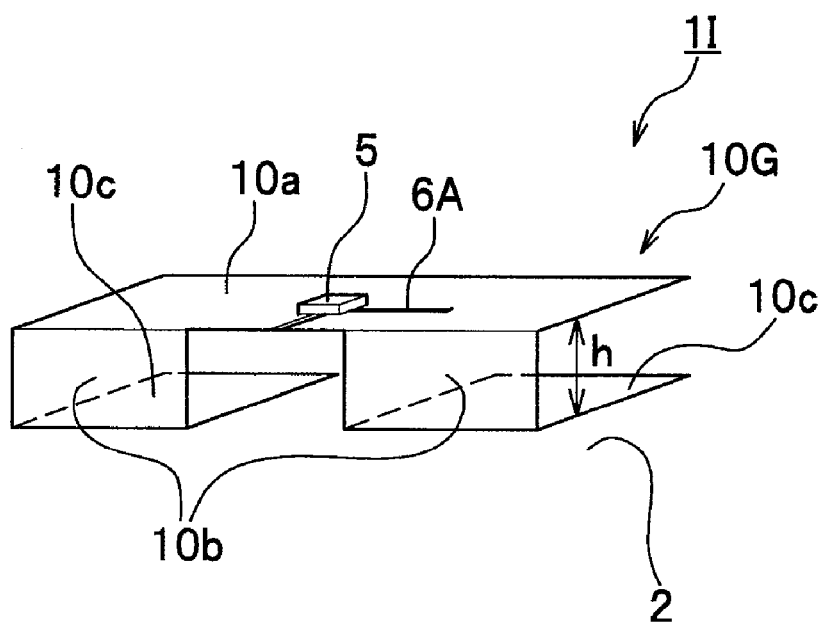
FIG. 5B is a perspective view of a modification of the RFIC tag shown in FIG. 5A.

FIG. 5B shows an RFIC tag 1I, a modification of the RFIC tag 1H, in which the connecting parts 10c of the thin metal plate 10F are bent below the slit part 10a. In this case, because the height h is maintained only by the strength of the cantilever beam of the thin metal plate 10G, the thin metal plate 10G should preferably be thicker than the RFIC tag 1A. In this case, the RFIC tag 1I can be mounted on the metal member 2 in the width direction in a more compact way than the RFIC tag 1C and the RFIC tag 1H.

Figure 6A:
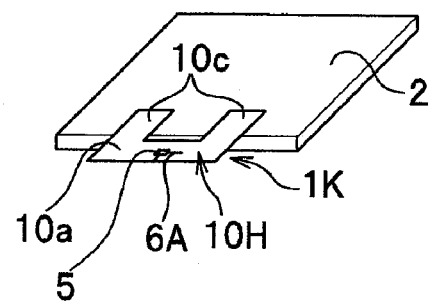
FIG. 6A is a perspective view showing a modification of the RFIC tag shown in FIG. 5A.

FIG. 6A is a diagram showing that an RFIC tag 1K, another modification of the RFIC tag 1H shown in FIG. 5A, is mounted on the metal member 2. This RFIC tag 1K, which uses a flat thin metal plate 10H whose top view is a horseshoe shape, is mounted on the metal member 2 in such a way that the slit part 10a does not overlap with the metal member 2.

Mounting the RFIC tag 1K in this way with the slit part 10a protruded from the edge of the metal member 2 prevents the IC chip 5 from being damaged even if the metal members 2 are stacked, because the IC chip 5 is held between, and is not pressed hard by, the metal members 2.

Figure 6B:
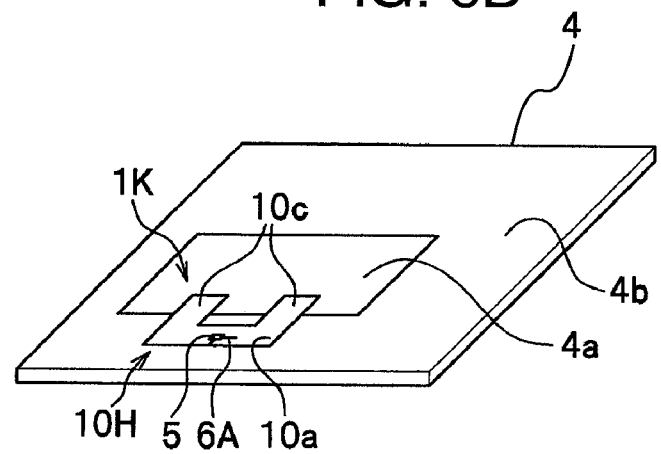
FIG. 6B is a perspective view showing that the RFIC tag shown in FIG. 6A is mounted on a circuit substrate.

FIG. 6B is a diagram showing that the RFIC tag 1K is mounted on a circuit substrate 4 such as a printed substrate. Referring to FIG. 6B, a wiring pattern area (metal object) 4a sufficiently larger than the RFIC tag 1K, which works as the ground, is provided in a position at a distance from the edge of the circuit substrate 4 and this wiring pattern area is surrounded by a circuit pattern area 4b. On the circuit substrate 4 configured in this way, the RFIC tag 1K is mounted in such a way that the slit part 10a does not overlap with the wiring pattern area 4a.

Connecting the small RFIC tag 1K to the large wiring pattern area 4a formed on the circuit substrate 4 in this way allows the RFIC tag 1K to have a sufficiently long communication distance.

Figure 6C:
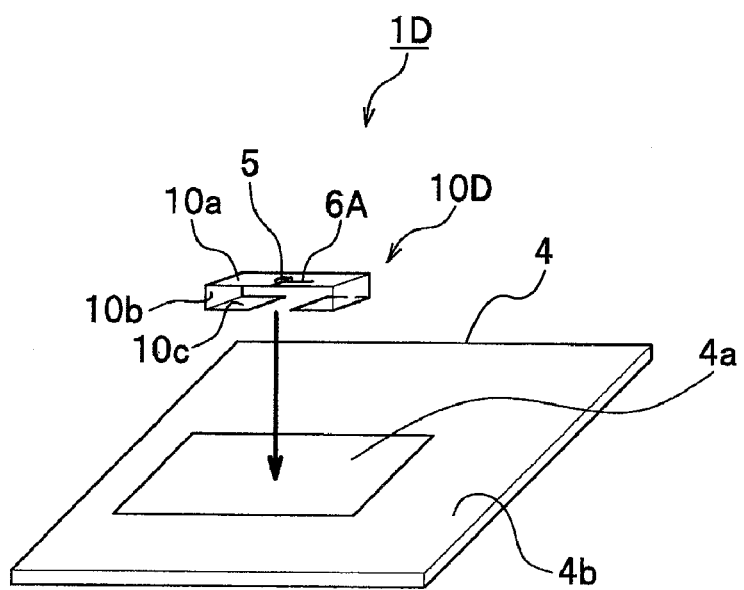
FIG. 6C is a perspective view showing a state in which the RFIC tag shown in FIG. 3 is applied to a circuit substrate.

FIG. 6C is a diagram showing the RFIC tag 1D applied to the circuit substrate 4. Referring to FIG. 6C, the RFIC tag 1D is mounted in the wiring pattern area 4a in a position at a distant from the edge of the circuit substrate 4 with the slit part 10a above the wiring pattern area 4a. As compared with the mounting method shown in FIG. 6B, the mounting method of the RFIC tag 1D on the circuit substrate 4 in this way allows the slit part 10a to be positioned within the wiring pattern area 4a, thus allowing the RFIC tag 1D to be mounted on the circuit substrate 4 more easily.

The IC chip 5 is mounted on the thin metal plate to form an RFIC tag in the first embodiment and its modifications described above, while the IC chip 5 is mounted on a thin metal film to form an RFIC tag in a modification described below. The following describes an example of a configuration in which the IC chip 5 is mounted on a glass substrate, in which the liquid crystal layer of the liquid crystal panel is included and in which the common electrode (metal object) is provided, to form an RFIC tag with the common electrode used as its antenna.

Figure 7A:
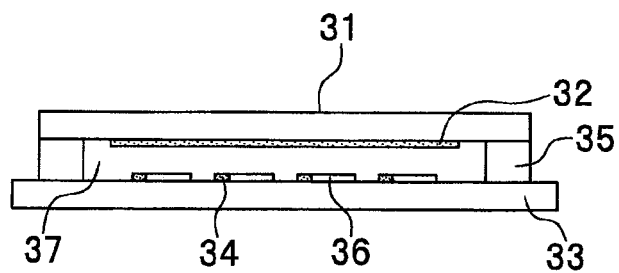
FIG. 7A is a cross sectional view showing top and bottom glass substrates between which liquid crystal is included.
Figure 7B:
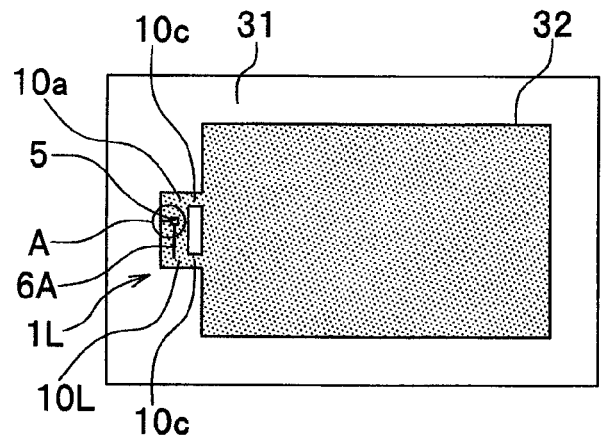
FIG. 7B is a general diagram of an RFIC tag whose antenna is a common electrode provided in the top glass substrate.
Figure 7C:
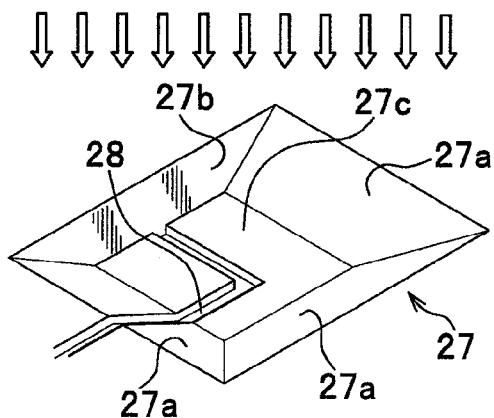
FIG. 7C is an enlarged perspective view of a concave portion in the part A shown in FIG. 7B.
Figure 7D:
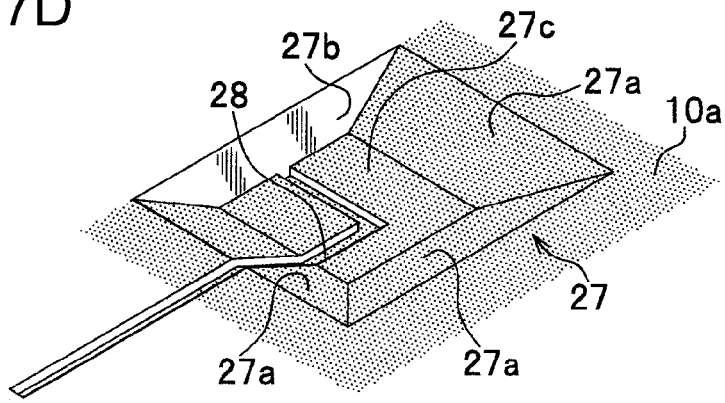
FIG. 7D is a perspective view after an ITO film is formed in the concave portion.

FIG. 7A is a cross sectional view of a top glass substrate and a bottom glass substrate between which liquid crystal is included, FIG. 7B is a general diagram of an RFIC tag whose antenna is the common electrode provided in the top glass substrate, FIG. 7C is an enlarged perspective view of a concave portion in the part A shown in FIG. 7B before an ITO (Indium-Tin-Oxide) film is formed, and FIG. 7D is a perspective view after the ITO film is formed in the concave portion.

As shown in FIG. 7A, a spacing is provided between a top glass substrate 31 and a bottom glass substrate 33, the four sides of the spacing are enclosed by a sealant 35, and liquid crystal is infused into the spacing to form a liquid crystal layer 37. A common electrode (metal object) 32 is provided on the inside surface of the top glass substrate 31 in advance. TFTs (Thin Film Transistor) 34 and pixel electrodes 36 are formed on the inside surface of the bottom glass substrate 33 in advance.

The common electrode 32, a large-pattern ITO transparent electrode, is formed on the top glass substrate 31 through spattering in many cases.

In this embodiment shown in FIG. 7A to FIG. 7D, a thin metal film (conductive thin film) 10L of an RFIC tag 1L is formed on the top glass substrate 31 through spattering at the same time the common electrode 32 is formed, as shown in FIG. 7B.

The thin metal film 10L comprises connecting parts 10c, whose longitudinal ends are bent and formed into the L shape for connection to the common electrode 32, and a slit part 10a having a slit 6A that is an L-shaped cut in the central part. The slit part 10a is 7 mm long at the minimum and preferably be 20 mm long. The IC chip 5 is electrically connected to, and mounted on, the thin metal film 10L, for example, through ultrasonic bonding in such a way that the signal input/output electrodes 5a and 5b not shown, which are terminals for supplying power to the antenna of the IC chip 5, are opposed each other across the slit 6A.

As shown in FIG. 7C in which the part A of FIG. 7B is enlarged (except the IC chip 5), a rectangular concave portion 27 as well as a groove 28, whose top view is an L shape and which extends from a bottom 27c of the concave portion 27 to the surface of the top glass substrate 31, are provided on the top glass substrate 31 on which the IC chip 5 is mounted. The rectangle-shaped bottom 27c is about the same size of the IC chip 5, and the depth from the smooth surface of the top glass substrate 31 is large enough to cover the thickness of the IC chip 5.

The side wall of the concave portion 27 corresponding to the longitudinal direction of the thin metal film 10L is an inclined plane 27a, and one of the side walls of the concave portion 27 corresponding to the width direction of the thin metal film 10L is a vertical plane 27b and the other is an inclined plane 27a. The end of the groove 28 in the bottom 27c, corresponding to the shorter part of the L shape, is extended to the vertical plane 27b and is closed there. The side wall of the groove 28 is a vertical plane.

The concave portion 27 and the groove 28 described above are molded when the top glass substrate 31 is fabricated.

After forming the concave portion 27 and the groove 28, the common electrode 32, as well as the thin metal film 10L, is formed through ITO spattering as shown by the arrows in FIG. 7C. FIG. 7D shows the concave portion after the thin metal film 10L is formed. Because, due to an anisotropic deposition, the thin metal film 10L of ITO is not formed on the side wall of the groove 28 and on the vertical plane 27b of the concave portion 27 when the thin metal film 10L is formed, the slit 6A is formed by the side wall of the groove 28 and the vertical plane 27b of the concave portion 27.

Forming the concave portion 27 and mounting the IC chip 5 therein as described above allow the IC chip 5, including its top surface, to be stored in the concave portion 27, thus making the surface of the top glass substrate 31 flat and smooth with no protrusion.

According to this modification shown in FIGS. 7A-7D, the large-pattern common electrode 32, to which the RFIC tag 1L is electrically connected via the connecting parts 10c, works as the antenna of the IC chip 5. Therefore, the longitudinal length of the slit part 10a of the RFIC tag 1L is as short as ¼ or less of the communication wavelength λ, with the minimum being 7 mm. Even if the longitudinal length is set preferably to 20 mm to extend the communication distance, the length is equal to or less than ¼ of the wavelength λ and therefore the communication can be performed via the small RFIC tag 1L. That is, because the common electrode 32, which is an ITO transparent electrode, works as the antenna of the IC chip 5 in this embodiment, the communication can be performed with the thin metal film 10L, on which the IC chip 5 is mounted, as an RFIC tag even if the length of the thin metal film 10L, on which the IC chip 5 including the impedance matching circuit is mounted, is shorter than ½ of the communication wavelength λ of the IC chip 5.

Although the slit 6A in FIG. 7B is formed through ITO spattering with the groove 28 and the vertical plane 27b formed on the top glass substrate 31, the slit 6A may also be formed by masking using a photo-resist.

Second Embodiment

Figure 8A:
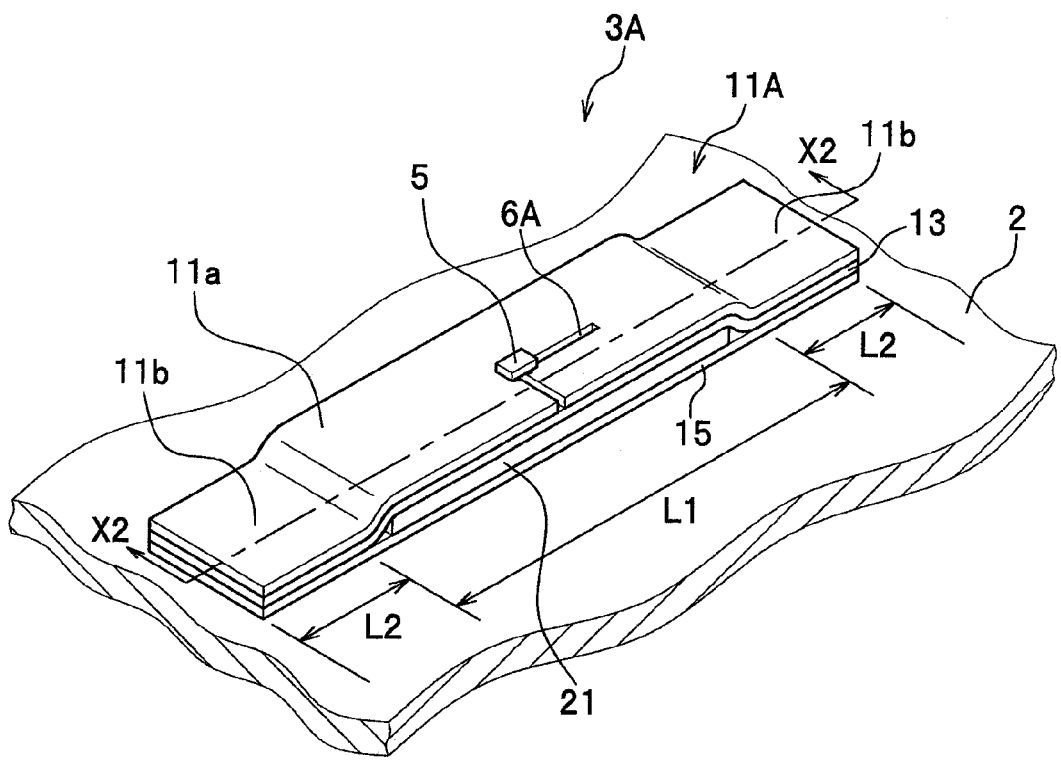
FIG. 8A is a perspective view showing a small inlet in a second embodiment of the present invention.
Figure 8B:
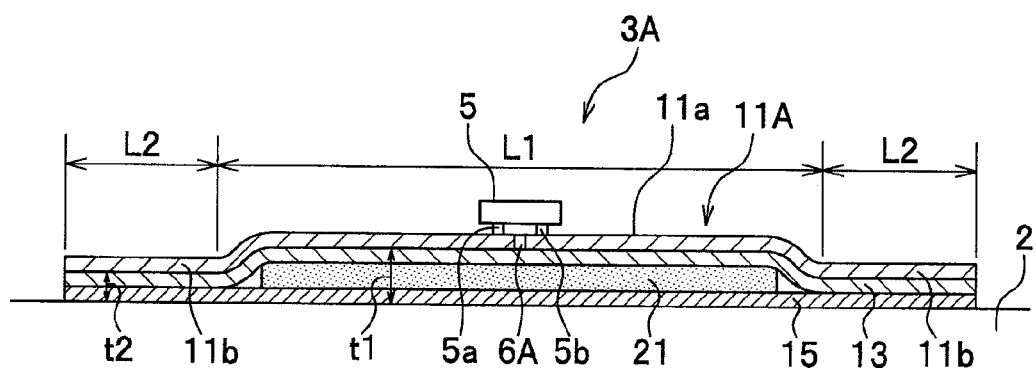
FIG. 8B is a cross sectional view taken on the arrow line X2-X2 in FIG. 8A.

Next, a small inlet-type RFIC tag in a second embodiment of present invention will be described with reference to FIG. 8A and FIG. 8B. FIG. 8A is a perspective view showing that a small inlet in this embodiment is mounted on a metal member (metal object), and FIG. 8B is a cross sectional view taken on the arrow line X2-X2 in FIG. 8A. The same reference numeral is given to components having the same configuration in the first embodiment and repetitive description will not be given.

The small inlet, as it is called in this embodiment, comprises an IC chip and a small antenna, which is long and wide enough to form a circuit for the impedance matching circuit of the IC chip thereon, and this small inlet is fixed on a film that is the base.

As shown in FIG. 8A, a small inlet 3A is structured in such a way that a small antenna 11A, which is a straight antenna composed of an electrically conductive thin metal film (for example, Al), is formed by deposing or printing on the surface of a base film 13 made of an insulating material such as polyethylene terepthalate (PET) or polypropylene (PP) and, in addition, an IC chip 5 is mounted in an intermediate part which is between connecting parts 11b at both ends in the longitudinal direction of the small antenna 11A and in which an L-shaped slit 6A is formed to create a circuit for impedance matching (hereinafter called a slit part) 11a. In this case, signal input/output electrodes 5a and 5b (see FIG. 8B) of the IC chip 5 are electrically connected to the small antenna 11A across the slit 6A via ultrasonic bonding, eutectic bonding, or an anisotropic conductive film.

The length of the small antenna 11A (L2+L1+L2) is about 30 mm, which is ¼ or less of the wavelength λ where λ is the wavelength of the 2.45 GHz electric wave used for transmission/reception. As shown in FIG. 8A, the small inlet 3A having this configuration also has a spacer member 21, composed of an insulating material pasted with an adhesive not shown, on the undersurface (mounting face side) of the slit part 11a, and is pasted on the surface of the metal member 2 with an adhesive material 15 applied to the bottom side of the small inlet 3A. At this time, both connecting parts 11b of the small antenna 11A are connected to the metal member 2 through electrostatic capacitory coupling via the base film 13 and the adhesive material 15. In this embodiment, the both connecting parts 11b of the small antenna 11A, each having a predetermined length L2, are connected to the metal member 2 through electrostatic capacitory coupling as the "predetermined ends of small antenna".

As shown in FIG. 8A, the slit part 11a has a slit 6A that is a cut extending from approximately the midpoint of one of the long sides to approximately the half of the width and, in addition, bent at a right angle into the longitudinal direction to form an L shape when viewed from top.

The thickness of the small antenna 11A is, for example 20 μm, the thickness of the base film 13 is, for example, 20 μm, and the thickness of the spacer member 21 is, for example, 80 μm or longer.

The longitudinal length L1 of the slit part 11a is, for example, 7 mm or longer that is the longitudinal length of the L-shaped slit 6A (for example, 3.5 mm) plus the length, equal to the width of the IC chip 5, at both ends in the longitudinal direction. The length L2 of the connecting part 11b is, for example, about 5 mm. Then, the total length L2+L1+L2 is about 17 mm (λ/7 or shorter in terms of wavelength λ). The experiment shows that the length L1 of about 20 mm and the total length L2+L1+L2 of about 30 mm make the communication length relatively long.

It is confirmed that, if the spacing t1 between the undersurface of the slit part 11a and the surface of the metal member 2 is 100 μm or longer, the communication can be performed. The larger the spacing t1, the longer the communication distance.

It is also confirmed that, when the connecting parts 11b are connected to the metal member 2 through electrostatic capacitory coupling, the communication can be performed if the spacing t2 between the undersurface of the connecting part 11b and the surface of the metal member 2 satisfies 0<t2<300 μm. As this spacing t2 becomes larger, the area of the connecting part 11b must be increased. That is, the longitudinal direction length L2 of the connecting part 11b must be increased.

The numeric values given above are those for a configuration where the longitudinal width of the IC chip 5 is about 0.5 mm and the communication frequency of the IC chip 5 is 2.45 GHz. The length of the slit 6A (about 3.5 mm), that is, the length of the slit part 11a, should be appropriately set according to the level of the impedance matching.

It is known that there is no problem with the electrostatic capacitory coupling to the maximum of 300 μm for the spacing t2 between the connecting part 11b and the surface of the metal member 2. Therefore, it is also possible that, with the total thickness (spacing t2) of the base film 13 and the adhesive material 15 set to 300 μm or shorter, the spacer member 21 is pasted on the metal member 2 without positively providing the spacer member 21 on the undersurface of the slit part 11a as in FIG. 8A. It is confirmed that the communication can be performed because this structure maintains the 100 μm or longer spacing t1 between the undersurface of the slit part 11a and the surface of the metal member 2.

When the signal input/output electrodes 5a and 5b of the IC chip 5 are electrically connected to the thin metal plate parts of the slit part 11a between which there is the slit 6A, the part of a stub 6a, formed by the slit 6A, is connected in series between the slit part 11a, which works as an antenna, the metal member 2, and the IC chip 5. The part of this stub 6a works as a series-connected inductance component. This inductance component cancels the capacitive component in the IC chip 5 for better impedance matching between the antenna and the IC chip 5.

That is, the IC chip 5 can use the enough-area metal member 2 as the antenna and, at the same time, match the impedance of the IC chip 5 with the impedance of the antenna formed by the slit part 11a and the metal member 2. The slit part 11a including such a slit 6A is called an impedance matching circuit.

The impedance matching is determined by the inductance component of the stub 6a which is determined by the lengths to the corner of the L shape of the slit 6A.

In this embodiment, because the metal member 2, which is the mounting member of the small inlet 3A, works as the antenna of the small inlet 3A, the longitudinal length of the slit part 11a of the small antenna 11A is as short as ¼ or less of the communication wavelength λ. Even if the length, whose minimum total length (L2+L1+L2) is about 17 mm, is extended preferably to about 30 mm to extend the communication distance, the longitudinal length is ¼ or less of the wavelength λ, meaning that the communication can be performed via the small inlet 3A. That is, because the surface of the metal object can be used as the antenna of the IC chip 5 in this embodiment, the communication can be performed with the thin metal plate, on which the IC chip 5 is mounted, as an RFIC tag even if the length of the small inlet 3A, on which the IC chip 5 including the impedance matching circuit is mounted, is shorter than ½ of the communication wavelength λ of the IC chip 5.

In addition, because the spacing, 100 μm or longer, is only required between the undersurface of the slit part 11a and the metal member 2 to allow it work as the impedance matching circuit, the protrusion from the surface of the metal member 2 is small and thus the small inlet 3A is less likely to be hung when used.

The metal member 2 to which the small inlet 3A in this embodiment is applicable is conductive metal such as aluminum (Al), carbon steel, stainless steel, and copper (Cu). Note that the small inlet 3A in this embodiment is applicable to stainless steel whether it is magnetic or not.

This small inlet 3A is pasted on the adhesive-applied side of a label paper to allow it to be pasted at the same time a label is pasted for use, for example, in the history management of steel lumber. Although the quality management of steel lumbers for atomic power plants or ships is especially important, a marking indicating the quality certificate, attached to the material shipment time, is not usually attached to an odd piece of lumber steel after a fixed-size steel pipe or steel plate is cut from the purchased lumber. Even in that case, if a label that has a small inlet 3A containing the content of the quality certificate is pasted on the lumber before the cut to store the content of quality certificate in the IC chip 5, the quality certificate can be easily checked at quality checking time by simply placing the odd piece of lumber over the reader/writer.

First Modification of Second Embodiment

Next, a first modification of the second embodiment will be described with reference to FIGS. 9A and 9B. The same reference numeral is given to components having the same configuration as that of the second embodiment and repetitive description will not be given.

The small inlet 3A is mounted on the surface of the metal member 2 in the second embodiment, while the small inlet 3A is embedded in a concave portion formed in a metal object in this modification.

Figure 9A:
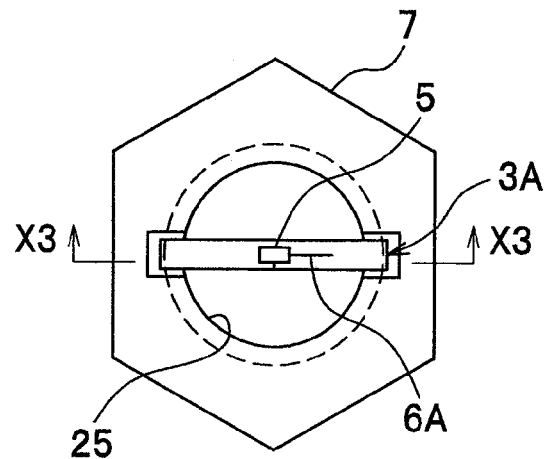
FIG. 9A is a top view of a bolt top showing how to mount the small inlet in a concave portion on the bolt top.
Figure 9B:
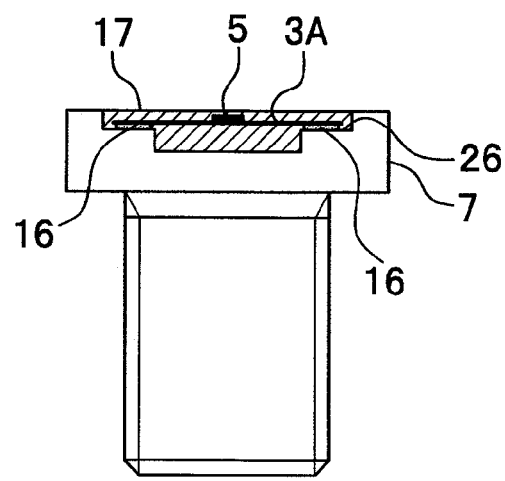
FIG. 9B is a cross sectional view taken on the arrow line X3-X3 in FIG. 9A.

FIG. 9A is a top view of a bolt top showing how to mount a small inlet in a concave portion on the bolt top. FIG. 9B is a cross sectional view taken on the arrow line X3-X3 in FIG. 9A. For easy understanding, FIG. 9A shows the state before a sealant 17 is filled.

In this modification, an approximately cylindrical concave portion 25 is formed on the top of a bolt (metal object) 7 made of a conductive metal such as carbon steel or stainless steel, shoulders 26 are formed in the radial positions projected outside the concave portion 25 and opposed each other, and the connecting parts of the small inlet 3A are fixed in the shoulders 26 with a conductive adhesive 16. After that, the sealant 17 is filled in the concave portion 25 to make the top of the bolt 7 flat.

The sealant 17 is an insulating material, and epoxy resin or low-temperature glass (hermetic seal) may be applied.

When the small inlet 3A is mounted in the concave portion 25 of a metal object in this way, it is necessary to maintain spacing not only between the bottom of the slip part and the bottom face of the concave portion 25 but also around the sides of the slit part as shown in FIG. 9A in order to avoid the effect of the peripheral wall of the concave portion 25. This configuration produces a state equivalent to that in which the small inlet 3A is mounted on the surface of a flat metal object.

As the small inlet 3A is mounted in a position nearer to the surface of the top of the bolt 7, the communication distance becomes longer.

Figure 9C:
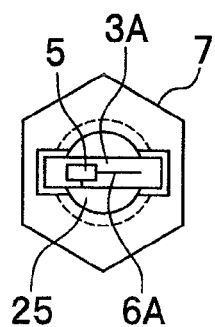
FIG. 9C is a top view of the top of a bolt when a bolt smaller in radius than the one shown in FIG. 9A is used.

FIG. 9C is a top view of the top of the bolt when a bolt smaller in radius than the one shown in FIG. 9A is used. The small inlet 3A must be arranged so that the slit part corresponds to the radial center of the concave portion 25.

Embedding the small inlet 3A in the concave portion 25 of the bolt 7 in this way with the sealant 17 filled therein allows the bolt 7 to work as an antenna to enable the communication with the IC chip 5 mounted in the embedded small inlet 3A. This structure prevents the small inlet 3A from being damaged because it is internally embedded. The bolt 7 in which the small inlet 3A is embedded can store quality management data on the goods, to which the bolt 7 is attached, in the IC chip 5 for use in managing the data. The bolt 7 itself can also be used as a screw-fixed RFIC tag.

Second Modification of Second Embodiment

Next, a second modification of the second embodiment will be described with reference to FIG. 10. The same reference numeral is given to components having the same configuration as that of the first modification and repetitive description will not be given.

Figure 10A:
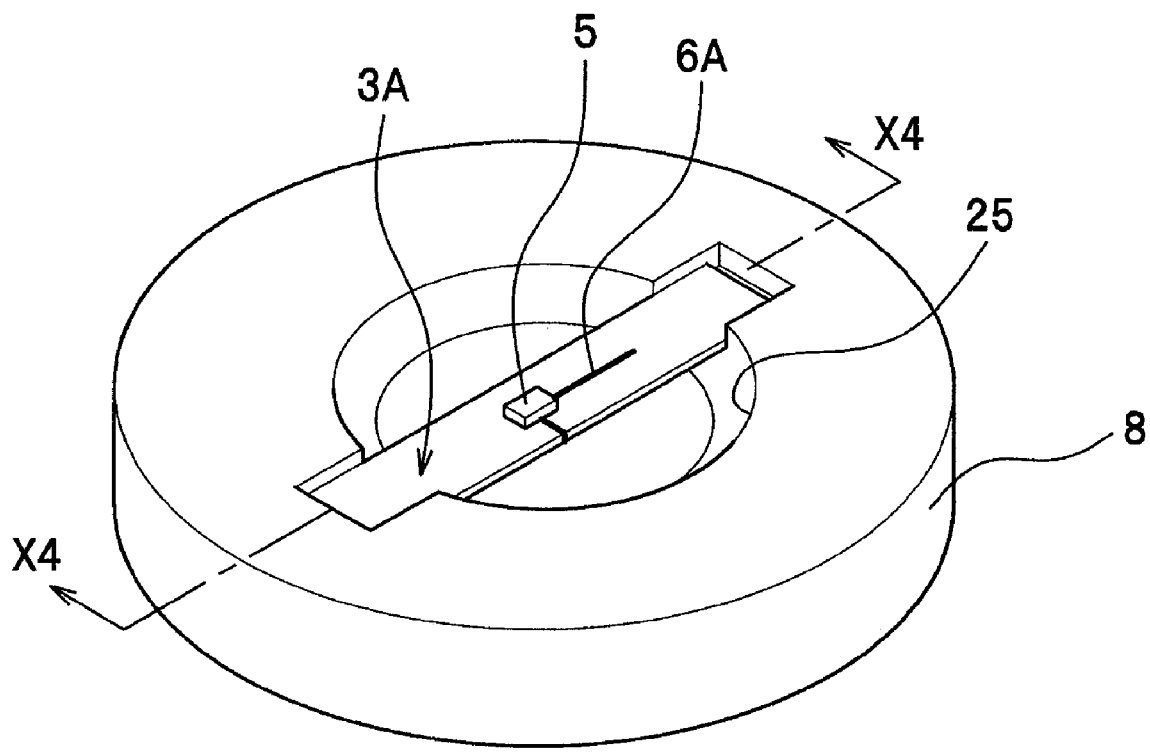
FIG. 10A is a perspective view of a coin showing how to mount the small inlet in a concave portion of the coin.
Figure 10B:
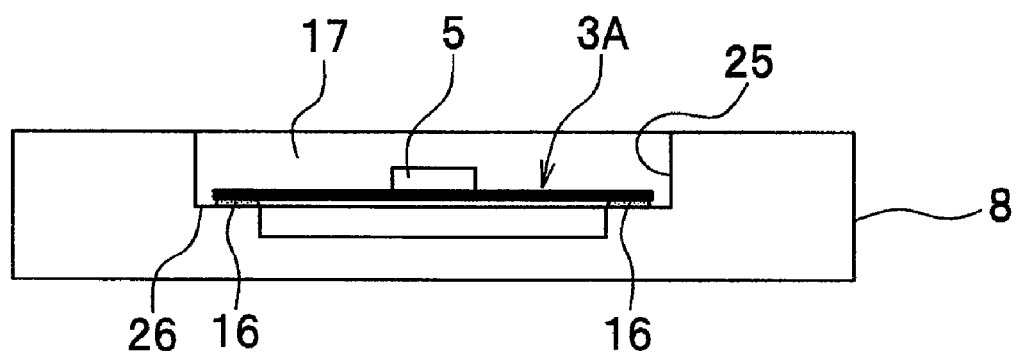
FIG. 10B is a cross sectional view taken on the arrow line X4-X4 in FIG. 10A.

FIG. 10A is a perspective view of a coin showing how to mount a small inlet in a concave portion of the coin. FIG. 10B is a cross sectional view taken on the arrow line X4-X4 in FIG. 10A. For easy understanding of the figure, FIG. 10A shows the state before a sealant 17 is filled.

In this modification, an approximately cylindrical concave portion 25 is provided on one face of a coin (metal object) 8 made of conductive metal such as brass, cupronickel, and aluminum alloy, shoulders 26 are formed in the radial positions projected outwards and opposed each other, and the connecting parts of the small inlet 3A are fixed on the shoulders 26 with a conductive adhesive 16. After that, the sealant 17 is filled in the concave portion 25 to make the top of the one face of the coin 8 flat.

Embedding the small inlet 3A in the coin 8 in this way allows the coin 8 to work as an antenna to enable the communication with the IC chip 5 mounted in the embedded small inlet 3A. This structure prevents the small inlet 3A from being damaged because it is internally embedded. The coin 8 in which the small inlet 3A is embedded can be used, for example, as a coin in a game hall. When the coin 8 given to a customer is inserted into a game machine at the entrance of a game hall where the customer plays games with the coin 8, the game machine communicates with the IC chip 5 for reading/writing data. This machine updates or stores an increase/decrease in the customer's point in the IC chip 5, thus eliminating the need for the customer to carry many coins to the game hall for playing games there. Data stored in the game machines, on which the customer plays, can also be used for analyzing the trend.

Although the small inlet 3A is mounted with the conductive adhesive 16 in the first and second modifications of the second embodiment described above, an insulating adhesive can also be used for mounting because the small inlet 3A is connected through electrostatic capacitory coupling via a base film not shown.

Although the small inlet 3A is used in the first and second modifications of the second embodiment described above, it is also possible to flatten the thin metal plate 10A of the RFIC tag 1A in the first embodiment and to solder the connecting parts on the shoulder 26 of the concave portion 25 for mounting.

In addition, it is also possible, after forming the concave portion 25 on the bolt 7 or coin 8, to infuse the sealant 17 from the bottom of the concave portion 25 to the top surface of the shoulder 26 to flatten the top surface, to form a connecting part on both the slit part and the shoulder 26 by printing a thin metal film (conductive thin film) using, for example, the ink jet method and, after that, to mount the IC chip 5 on the slit part to configure an RFIC tag. Finally, the sealant 17 is filled to the top end of the concave portion 25 to flatten the top end surface of the bolt 7 or coin 8.

In addition, in the first embodiment and its modifications described above and in the second embodiment and its modifications described above, the slit forming an impedance matching circuit is formed as an L shape. The present invention is not limited to this shape but a T-shaped slit 6B shown in FIG. 11A may also be used.

Figure 11A:
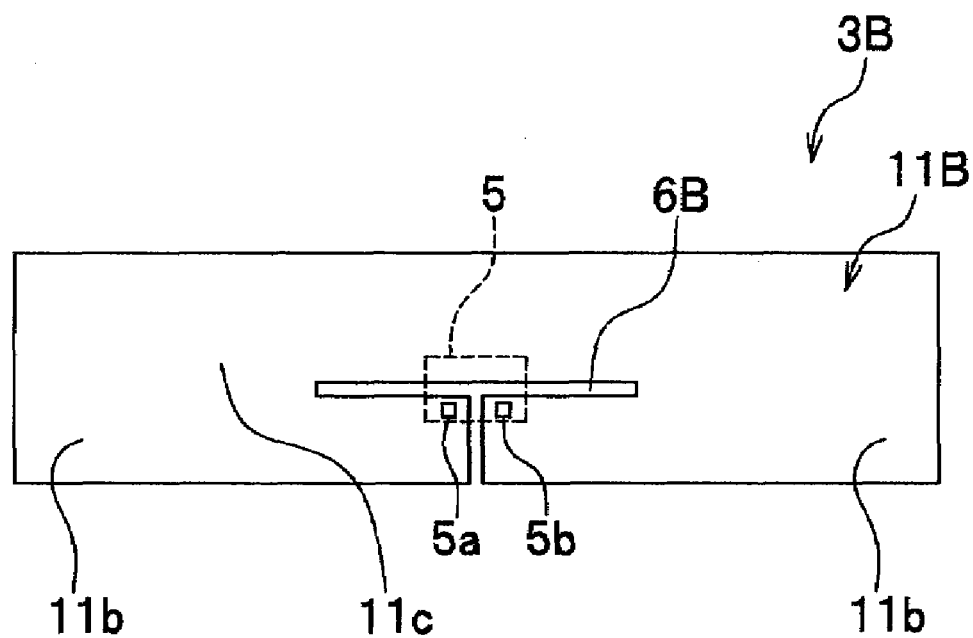
FIG. 11A is a top view of a small inlet on which a slit with a different top-view shape is formed.
Figure 11B:
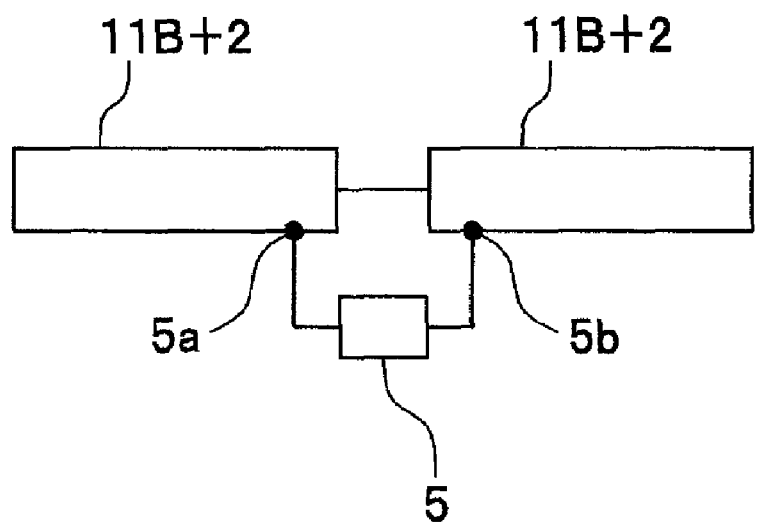
FIG. 11B is an equivalent circuit when the small inlet is mounted on a metal member.

FIG. 11A is a top view of a small inlet 3B not including the IC chip 5 for easy understanding, and FIG. 11B is an equivalent circuit when the small inlet 3B is mounted on a metal member.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. An RFIC tag having an IC chip mounted on a conductive thin plate or thin film, said IC chip being activated by a radio wave, wherein
   said conductive thin plate or thin film is mounted in such a way that connecting parts, provided at both ends thereof, are connected to a metal object electrically or via electrostatic capacitory coupling to cause said metal object to work as an antenna of said IC chip,
   said conductive thin plate or thin film has an impedance matching circuit in an intermediate part for matching an impedance of said antenna with an impedance of said IC chip, and
   said impedance matching circuit is mounted with at least a predetermined spacing from said metal object.

2. The RFIC tag according to claim 1 wherein said impedance matching circuit is an L-shaped or T-shaped slit provided in the intermediate part of said conductive thin plate or thin film.

3. The RFIC tag according to claim 2 wherein said IC chip has terminals connected to said conductive thin plate or thin film in such a way that said terminals are positioned across the slit, said terminals being electrically connected to the antenna.

4. The RFIC tag according to claim 2 wherein said conductive thin plate or thin film is mounted via a spacer member in such a way that at least a predetermined spacing is provided between the slit and a surface of said metal object.

5. The RFIC tag according to claim 1 wherein a longitudinal-direction length of said impedance matching circuit, which is on said conductive thin plate or thin film with a predetermined spacing from said metal object, is shorter than $\lambda/2$ where $\lambda$ is a wavelength of a radio wave to be transmitted or received.

6. An RFIC tag having an IC chip mounted on a conductive thin plate or thin film, said IC chip being activated by a radio wave, wherein
   said conductive thin plate or thin film comprises connecting parts at both ends thereof for connecting to a metal object electrically or via electrostatic capacitory coupling; and an impedance matching circuit when said IC chip is mounted in an intermediate part, a length of said impedance matching circuit being less than $\frac{1}{2}$ of a wavelength $\lambda$ of the radio wave and
   when said both ends are mounted on said metal object via said connecting parts, the intermediate part is positioned with a predetermined spacing from said metal object.

7. The RFIC tag according to claim 1 wherein said conductive thin plate is a conductive thin metal plate, a thin plate on which a conductive metal film is formed, or a conductive resin.

8. A method of using an RFIC tag having an IC chip mounted on a conductive thin plate or thin film having an impedance matching circuit, said IC chip being activated by a radio wave, wherein
   connecting parts, provided at both ends of said conductive thin plate or thin film, are connected to a metal object electrically or via electrostatic capacitory coupling to cause said metal object to work as an antenna of said IC chip, and
   on said conductive thin plate or thin film, said impedance matching circuit is mounted with at least a predetermined spacing from said metal object.

9. A method of using a small inlet-type RFIC tag including an IC chip activated by a radio wave and a small antenna having an impedance matching circuit, wherein
   connecting parts, provided at predetermined ends of said small antenna, are connected to a metal object electrically or via electrostatic capacitory coupling to cause said metal object to work as an antenna of said IC chip, and
   on said small antenna, said impedance matching circuit is mounted with at least a predetermined spacing from said metal object.

10. The small inlet-type RFIC tag used in the method of using according to claim 9, wherein a length of said small antenna is shorter than $\lambda/2$ where $\lambda$ is a wavelength of a radio wave to be transmitted or received.

11. The RFIC tag according to claim 10 wherein
    said small antenna is configured by forming a thin metal film, which has said impedance matching circuit, on a base film and
    a spacer member of a predetermined thickness is pasted on a mounting face side of said base film corresponding to said impedance matching circuit.

12. The RFIC tag according to claim 11 wherein said impedance matching circuit is an L-shaped or T-shaped slit provided on the thin metal film.

13. A method of using an RFIC tag having an IC chip mounted on a conductive thin plate or thin film having an impedance matching circuit, said IC chip being activated by a radio wave, wherein
- a concave portion is provided on a metal object and a shoulder is formed in the concave portion,
- connecting parts, provided at both ends of said conductive thin plate or thin film, are connected to said shoulder electrically or via electrostatic capacitory coupling to cause said metal object to work as an antenna of said IC chip, and
- on said conductive thin plate or thin film, said impedance matching circuit is mounted with at least a predetermined spacing from a peripheral wall and from a bottom face of said concave portion.

14. A method of using a small inlet-type RFIC tag including an IC chip activated by a radio wave and a small antenna having an impedance matching circuit, wherein
- a concave portion is provided on a metal object and a shoulder is formed in the concave portion,
- predetermined ends of said small antenna are connected to said shoulder electrically or via electrostatic capacitory coupling to cause said metal object to work as an antenna of said IC chip, and
- on said small antenna, said impedance matching circuit is mounted with at least a predetermined spacing from a peripheral wall and from a bottom face of said concave portion.

* * * * *